United States Patent [19]

Quelfeter et al.

[11] Patent Number: 5,307,942
[45] Date of Patent: May 3, 1994

[54] ELECTRONIC, ESPECIALLY TELECOMMUNICATION EQUIPMENT RACK

[75] Inventors: Guy Quelfeter, Ploulec'h; René Féménia, Plouisy; Denis Le Jeune, Morlaix; Rémi Verdurand, Neuilly; Claude Bertin, Paris, all of France

[73] Assignee: Alcatel Cit, Paris, France

[21] Appl. No.: 981,591

[22] Filed: Nov. 25, 1992

[30] Foreign Application Priority Data

Nov. 29, 1991 [FR] France ................. 91 14858

[51] Int. Cl.⁵ ............................................. A47F 5/00
[52] U.S. Cl. .................................................. 211/26
[58] Field of Search ............... 211/26, 86; 361/428, 361/429

[56] References Cited

U.S. PATENT DOCUMENTS 3,228,532  1/1966  Sisk et al. ....................... 211/26
4,496,057  1/1985  Zenitani et al. ................. 211/26
4,662,524  5/1987  Fullenkamp et al. ............ 211/26 X
4,715,502 12/1987  Salmon ............................ 211/26
4,988,008  1/1991  Blum et al. ..................... 211/26 X

FOREIGN PATENT DOCUMENTS 0057580  8/1982  European Pat. Off. .
3731200  3/1989  Fed. Rep. of Germany .
 613827 10/1979  Switzerland .

Primary Examiner—Alvin C. Chin-Shue
Assistant Examiner—Sarah A. Lechok
Attorney, Agent, or Firm—Sughrue, Mion, Zinn, Macpeak & Seas

[57] ABSTRACT

Each upright of an electronic, especially telecommunication equipment rack comprises an outer profile and an inner profile delimiting a hollow interior volume used to run connections along equipment supported by said uprights. The profiles are such that the interior volume has in the heightwise and depthwise directions an opening accessible from the front side of the rack providing easy access to the connections along all of their path between the points at which they enter and leave the interior volume.

10 Claims, 3 Drawing Sheets

ELECTRONIC, ESPECIALLY TELECOMMUNICATION EQUIPMENT RACK

BACKGROUND OF THE INVENTION

1. Field of the Invention

The present invention concerns the general construction of an electronic, especially telecommunication equipment rack.

2. Description of the Prior Art

In equipment of this kind the printed circuit boards carrying the basic electronic components and constituting the equipment are usually grouped together in structures called subracks in which they are usually disposed vertically, these subracks being in turn grouped together in structures called racks in which they are usually disposed horizontally.

The racks are usually of the type comprising two uprights supporting the subracks and each having a shape designed to constitute a hollow interior volume for passing connections internal to the rack along the subracks from an entry point at which the connections are fed into the rack and an exit point where they leave this volume to run transversely to their destination point on the subrack, this interior volume being open to provide access to the connections from one side of the rack, called the access side, from which an operator can access the subracks.

The remainder of the description concerns only one upright per rack and therefore only one interior volume, but it is obvious that the rack comprising two identical uprights has a second interior volume identical and symmetrical to that described.

The destination points for the same subrack are usually grouped together on a device called a connection strip and comprising, for example, on the posterior part of the subrack a heightwise extension of the backplane printed circuit board to which are fixed and connected the half-connectors providing connections to these destination points. Mechanical and electromagnetic protection is provided by the appropriate adaptation of the mechanical structure of the back and top of the subrack. The resulting strip is set back from the subrack front panel and therefore provides a space between two superposed subracks providing access to the exit points and to the connectors.

This type of rack is usually of substantially parallelepiped shape, having upper and lower sides, two lateral sides and front and rear sides, one of the last two sides constituting said access side. The interior volume is also usually of substantially parallelepiped shape, fitting within the aforementioned parallelepiped and consequently having a height and depth less than or equal to those of the latter and a width very much less than that of the latter. In the following the expression "first side" refers to that of the lateral sides of an interior volume that is inside the rack, the term "second side" refers to the front or rear side of an interior volume which is accessible via the access side of the rack and the terms "third side" and "fourth side" respectively refer to the sides of an interior volume respectively facing said first and second sides.

The present invention is more particularly concerned with the problem of access by an operator to said connections, especially those conveying signals to be processed by the equipment in the rack, which may need to be worked on, possibly after installation of the equipment, for example to modify the wiring of these connections to said destination points or to replace a faulty connection. More generally, it must be possible under normal operating conditions to solve problems arising on any particular connection without disturbing or disconnecting a neighboring connection even for a minimal time interval. Given these conditions, it is essential that the operating personnel has easy and individual access to each of the various connecting cables of a rack.

Until now, this problem has usually been solved in the manner now to be described with reference to FIGS. 1 and 2 showing two prior art embodiments of racks of the above type.

FIG. 1 shows a typical rack of this type in schematic plan view. In this example an upright 1 delimits an interior volume 2 symbolically represented by the crossed dashed lines and whose depth is similar to that of the rack 3, the difference in depth being used to fix subracks 4 to the uprights. Such fixing, symbolically represented at 5, uses the second side 6 of this interior volume.

The interior volume has an opening occupying depthwise the majority of the first side of the interior volume, said opening 7 containing said exit points and the solid parts 8 and 9 of this side increasing the stiffness of the upright. A drawback of this type of upright is that it considerably complicates access by an operator to the interior volume. Assuming that work must be carried out without disturbing or interrupting the operation of the equipment whose connection do not require any work to be carried out, in other words excluding any possibility of taking out a subrack to facilitate such access, considerable skill and dexterity are required to guide the connections along the length of this interior volume from the entry point which is usually on the upper or lower side of the interior volume and at which the connections are fed into the rack and the exit point situated in this case on said first side where the connections leave the interior volume to be run transversely to their destination point on the equipment via a connecting strip as previously explained. Guidance is here rendered difficult by the fact that the interior volume is usually extremely narrow to leave the maximum space available for electronic equipment inside the rack.

FIG. 2 shows another example of this type of rack, also in schematic plan view.

In this example an upright 10 delimits an interior volume 11 symbolically represented by crossed dashed lines whose depth is substantially equal to half that of the rack 12. The subracks 13 are fixed substantially halfway along the depth of the rack to the first side 14 of this interior volume using an intermediate spaced 14. The interior volume is open on its second side 16 to provide access to said exit points.

In the present example of access to the interior of the rack from its front side, all the destination points of said connections are again disposed on a strip at the rear of the subrack and a space is left between two superposed subracks. A drawback of the type of upright used here is that it imposes a plurality of successive changes of direction on the path of said connections between the point at which they leave said interior volume and their destination point on said equipment, with one part of this path in particular situated perpendicular to said access side, rendering the stowage of these connections within the rack somewhat anarchic and difficult to carry out over this portion of the path.

An object of the present invention is to provide a rack structure for electronic, especially telecommunication equipment whereby the above drawbacks can be avoided.

SUMMARY OF THE INVENTION

The present invention consists in an electronic, especially telecommunication equipment rack comprising two uprights supporting said equipment one at least of which has a shape adapted to constitute a hollow interior volume for passing connections along said equipment from an entry point at which said connections are fed into the rack to an exit point at which they leave said interior volume to run transversely to their respective destination point on said equipment, said interior volume being open to provide access to said connections from an access side of said rack from which there is provision for an operator to access said equipment, in which the rack volume has a heightwise first opening accessible from said access side and whose height is sufficient to provide access to said connections on their path situated along said equipment and a depthwise second opening also accessible from said access side and adapted to contain said exit points.

BRIEF DESCRIPTION OF THE DRAWINGS

Other objects and features of the invention will emerge from the following description of one embodiment of the invention given with reference to the appended drawings in which, in addition to FIGS. 1 and 2 relating to the prior art and described above.

DETAILED DESCRIPTION OF THE INVENTION

Figure 1:
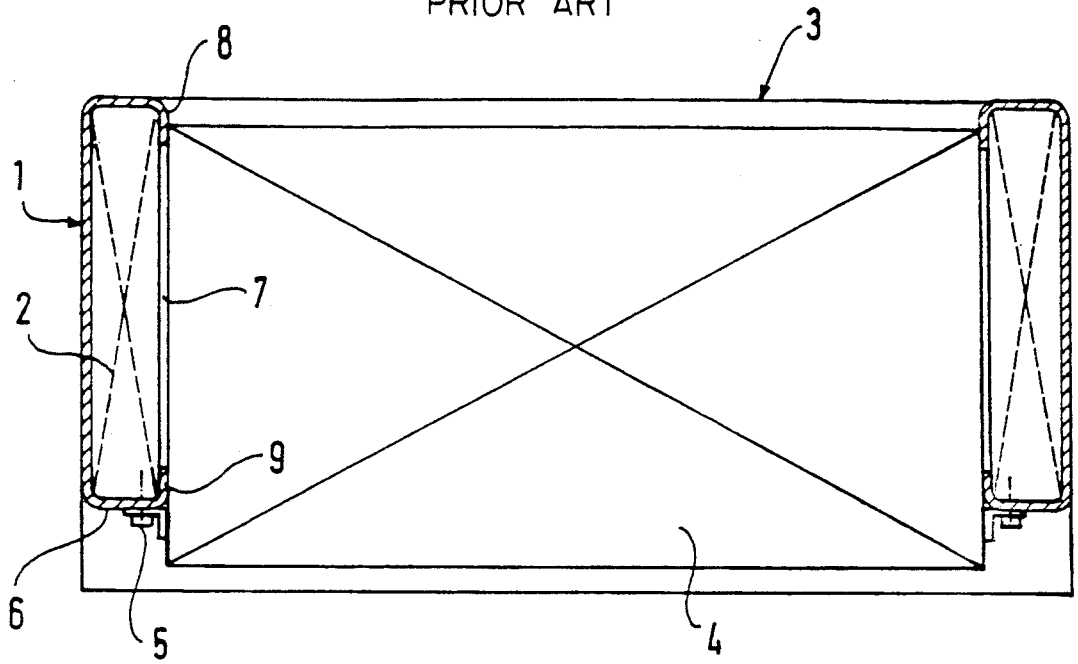
Figure 2:
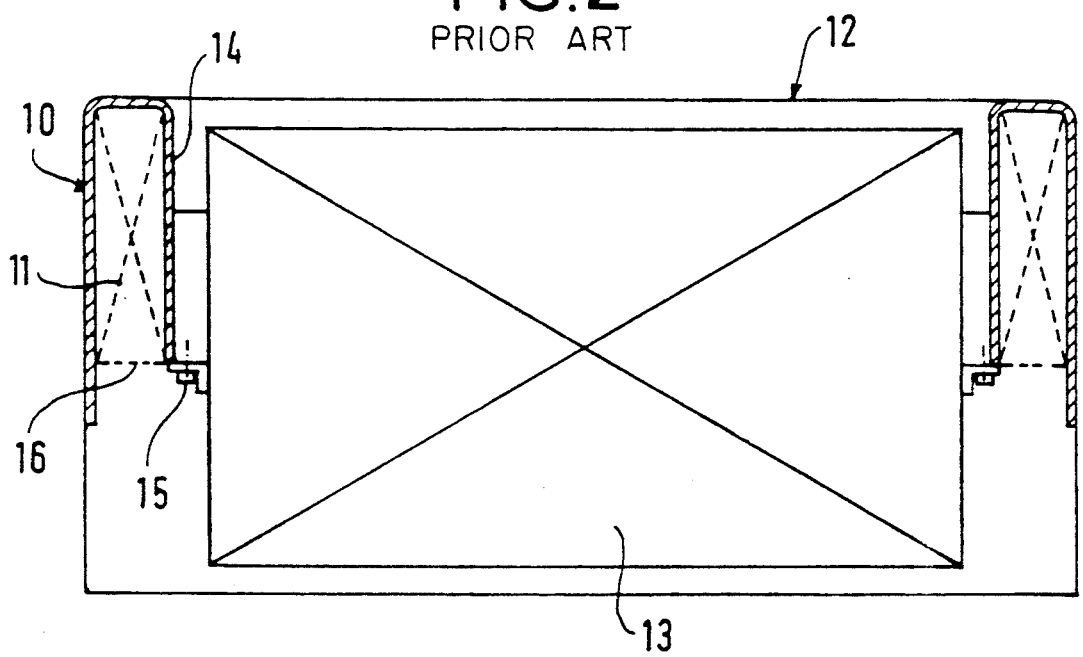

The embodiment of the invention described hereinafter with reference to FIGS. 3 and 4 relates to substantially parallelepiped shaped racks and interior volumes and the same conventions are used to denote sides of these parallelepipeds as previously. In this example, and again as considered previously herein, access to the interior of the rack is obtained from the front side of the rack.

In this embodiment each of the two rack uprights comprises two profiles:

an outer profile 20 occupying the third and fourth sides 21' and 21" of said interior volume 21 symbolically represented by crossed dashed lines, and an inner profile 22 located substantially at the intersection of the first and second sides 17 and 18 of the interior volume.

The interior volume 21 therefore has in the heightwise direction on its second side 18 an opening accessible from said access side, in this instance the front side, and providing access to said connections, in this instance over all of their path running along said equipment. It has depthwise on its first side 17 an opening which is also accessible from said access side and which contains said exit points, so providing easy access to said connections all along their path between said entry and exit points of this volume and so avoiding the drawbacks mentioned hereinabove.

Figure 3:
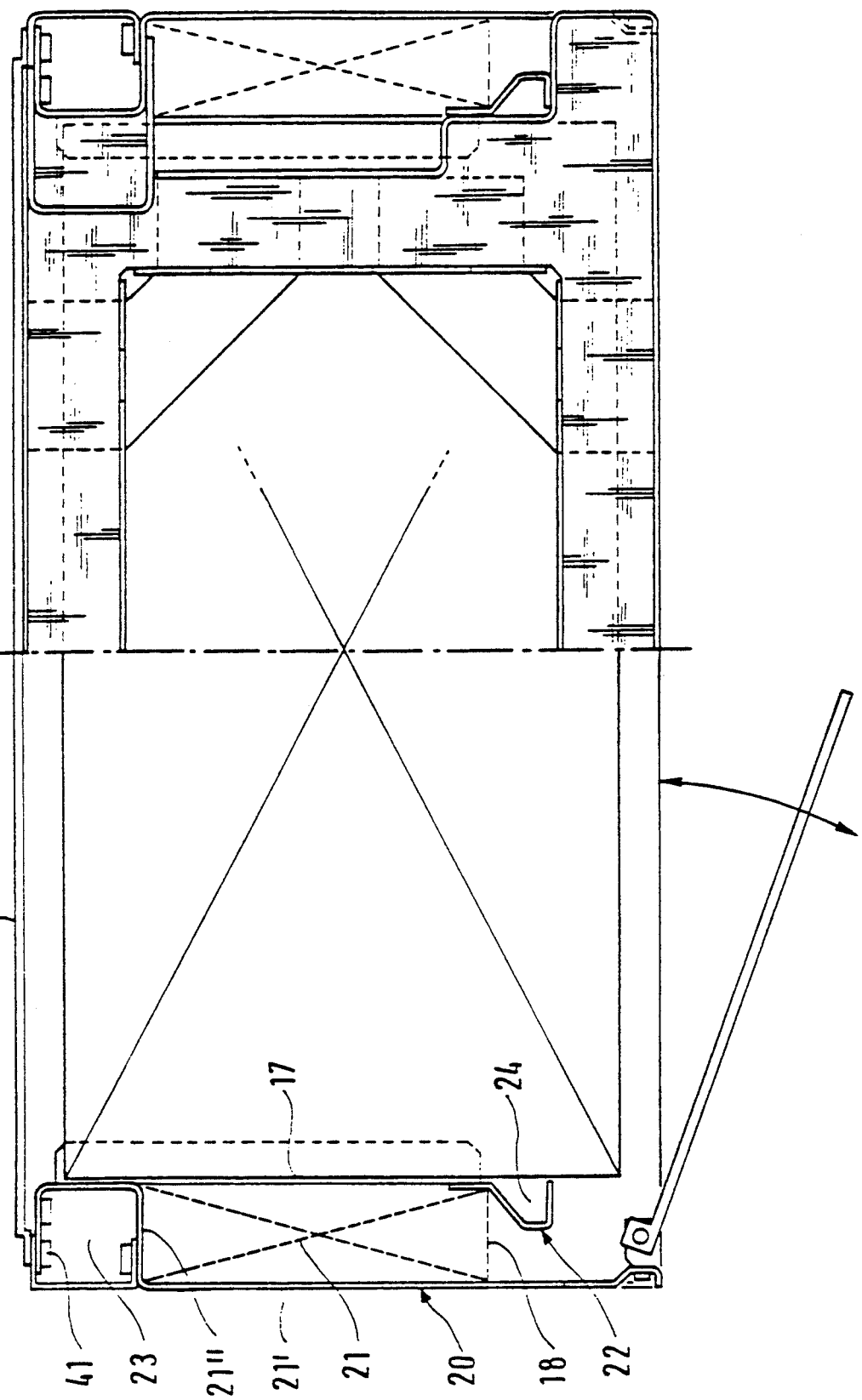
FIG. 3 is a plan view of an electronic equipment rack in accordance with the invention with the lefthand half of the top side of the structure removed.
Figure 4:
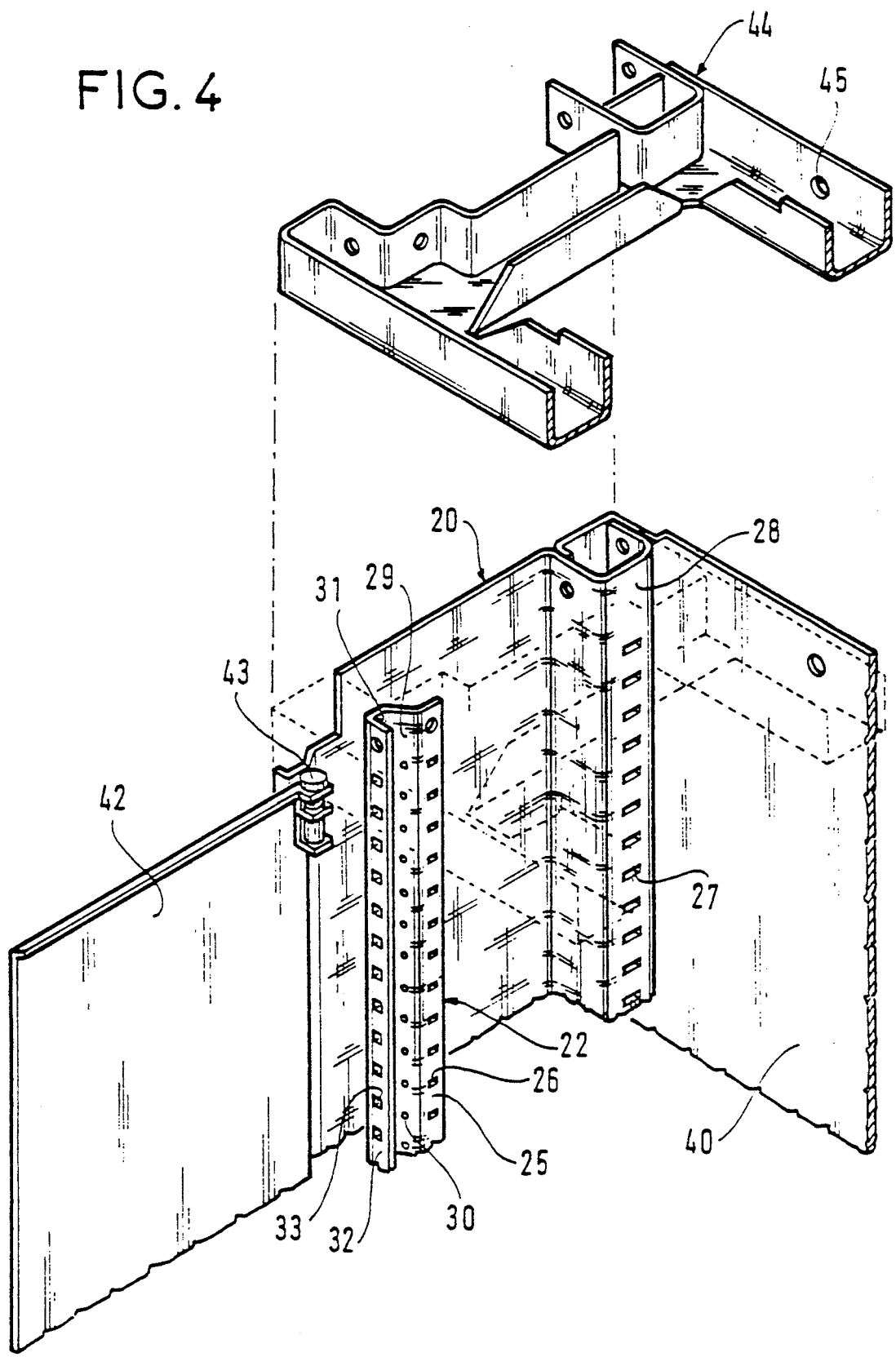
FIG. 4 is a partial exploded perspective view of the rack.

In the embodiment shown in FIGS. 3 and 4 the outer profile 20 has in its rear part beyond said fourth side a shape delimited by two consecutive right-angle bends respectively oriented towards the rear of the rack and towards the respective lateral side of the rack. It constitutes another hollow interior volume 23 of substantially square cross-section which is not intended to contain said connections (unlike the interior volume 21) but whose contour increases the stiffness of the profile. The volume 23 may be used to accommodate power supply or other cables.

The shape of the inner profile 22 is delimited by three successive bends including a right-angle bend and two equal and opposite obtuse angle bends. This shape constitutes another hollow interior volume 24 of substantially trapezoidal cross-section which is not intended to accommodate said connections (unlike the interior volume 21) but whose contour increases the stiffness of this profile.

In this example the inner profile therefore has in succession:

a side 25 on said first side of the interior volume 21 in which holes 26 are advantageously formed for fixing support strips for said subracks (not shown explicitly in FIG. 4 but shown in dashed outline in FIG. 3) in conjunction with similar holes 27 on the side 28 of the outer profile delimiting the interior volume 23, which is aligned with said first side, a side 29 oblique to the previous side 25 in which holes 30 are advantageously formed for fixing accessories such as, for example, devices for holding and locating said connections inside the interior volume 21 (not explicitly shown in FIG. 4), a side 31 parallel to said first side, and a side 32 parallel to said second side and in which holes 33 are advantageously formed for fixing subracks (not shown explicitly in FIG. 4) to the inner profile, for example.

The rack shown in FIGS. 3 and 4 further comprises, in addition to the uprights already described and forming the lateral sides of the rack:

a rear panel 40 fixed by fixings 41 to the side of the outer profile delimiting the interior volume 23 which is parallel to said fourth side and on the rear side of the rack, two front doors 42 fixed to a forwards extension of the outer profile 20 by a fixing 43, and a structure whereby these various components are assembled together, this structure having a lower part and an upper part which may be identical and which comprises, for example, as shown in the case of the upper part 44, a rectangular beam provided with holes 45 for fixing it to said uprights and to said rear panel.

There is claimed:

1. Electronic telecommunication equipment rack comprising two uprights for supporting said equipment, at least one of which has a shape constituting a hollow interior volume for passing connections along said equipment from an entry point at which said connections are fed into the rack, to an exit point at which they leave said interior volume and run transversely to their respective destination point on said equipment, said interior volume being open to provide access to said connections from an access side of said track from which an operator has access to said equipment, said rack defining said interior volume having a heightwise first opening accessible from said access side and whose height is sufficient to provide access to said connections on their path situated along said equipment and a depthwise second opening also accessible from said access side and adapted to contain said exit points.

2. Rack according to claim 1 of substantially parallelepiped shape having two lateral sides and front and rear sides, one of said front and rear sides constituting said access side, wherein said interior volume is also of substantially parallelepiped shape within the aforementioned parallelepiped, said first opening is one of said first and second sides of said interior volume which is accessible from said access side of the rack and said second opening is on a first side of said interior volume which is one of said lateral sides of said interior volume inside the rack.

3. Rack according to claim 2 wherein the height of said openings occupies all of the height of the respective sides of said interior volume and said uprights comprise an outer profile occupying third and fourth sides of said interior volume respectively opposite said first and second sides and an inner profile located substantially at the intersection of said first and second sides.

4. Rack according to claim 3 wherein said equipment is fixed to said inner profile.

5. Rack according to claim 3 wherein said outer profile has a shape beyond said fourth side adapted to constitute another hollow interior volume.

6. Rack according to claim 3 wherein said inner profile has a shape adapted to constitute another hollow interior volume.

7. Rack according to claim 6 wherein said inner profile has a plurality of sides delimiting said hollow interior volume in which are formed holes for fixing internal components to the rack.

8. Rack according to claim 7 wherein one side is provided with holes for fixing equipment subrack support strips.

9. Rack according to claim 7 wherein one side is provided with equipment subrack fixing holes.

10. Rack according to claim 7 wherein one side is provided with holes for fixing components for locating and retaining said connections in said interior volume.

* * * * *